US012643733B2

(12) United States Patent
Yu

(10) Patent No.: US 12,643,733 B2
(45) Date of Patent: Jun. 2, 2026

(54) SEA-LAND-AIR INTERMODAL TRANSPORTATION APPARATUS FOR MAGNETIC RESONANCE IMAGING APPARATUS

(71) Applicants: Beijing Linking Technology Development Co., Ltd., Beijing (CN); Beijing Energy Prime Technology Services Co., Ltd., Beijing (CN); Beijing Ray Power Environmental Protection Technology Co., Ltd., Beijing (CN)

(72) Inventor: Xiaona Yu, Beijing (CN)

(73) Assignees: Beijing Linking Technology Development Co. Ltd., Beijing (CN); Beijing Energy Prime Technology Services Co. Ltd., Beijing (CN); Beijing Ray Power Environmental Protection Technology Co. Ltd., Beijing (CN)

( * ) Notice: Subject to any disclaimer, the term of this patent is extended or adjusted under 35 U.S.C. 154(b) by 313 days.

(21) Appl. No.: 18/371,981

(22) Filed: Sep. 22, 2023

(65) Prior Publication Data

US 2024/0343474 A1 Oct. 17, 2024

Related U.S. Application Data

(63) Continuation of application No. PCT/CN2023/088065, filed on Apr. 13, 2023.

(51) Int. Cl.
*B65D 88/12* (2006.01)
*B65D 88/74* (2006.01)
*G01R 33/28* (2006.01)

(52) U.S. Cl.
CPC ............. *B65D 88/12* (2013.01); *B65D 88/74* (2013.01); *G01R 33/28* (2013.01)

(58) Field of Classification Search
CPC ........ B65D 88/12; B65D 88/74; G01R 33/28; G01R 33/3802; G01R 33/3804
See application file for complete search history.

(56) References Cited

FOREIGN PATENT DOCUMENTS

CN 204872266 U * 12/2015
CN 211870001 U * 11/2020

* cited by examiner

*Primary Examiner* — Joseph F Trpisovsky
(74) *Attorney, Agent, or Firm* — Leydig, Voit & Mayer, Ltd.

(57) ABSTRACT

A sea-land-air intermodal transportation apparatus for a magnetic resonance imaging apparatus is described. The apparatus includes a primary container body, a secondary container body, a power supply system, a temperature controlling system, and a monitoring system. The primary container body is mounted with the temperature controlling system, the monitoring system and a slide rail device for fixing in place the magnetic resonance imaging apparatus. The secondary container body is mounted with the power supply system, and the primary container body and the secondary container body can be fixedly mounted on the same hoisting frame. On shore, the primary container body is powered by the power supply system of the secondary container body. On board a ship or in a plane, the apparatus (es) of the primary container body is/are connected to a mains power supply interface or directly to a shipboard power supply.

10 Claims, 8 Drawing Sheets

SEA-LAND-AIR INTERMODAL TRANSPORTATION APPARATUS FOR MAGNETIC RESONANCE IMAGING APPARATUS

CROSS-REFERENCE TO RELATED APPLICATIONS

This application is a continuation of International Application No. PCT/CN2023/088065, filed on Apr. 13, 2023, which is expressly incorporated by reference in its entirety, including any references contained therein.

TECHNICAL FIELD

The present disclosure relates to a transportation apparatus for a magnetic resonance imaging apparatus, and specifically to a sea-land-air intermodal transportation apparatus for a magnetic resonance imaging apparatus.

BACKGROUND

The magnetic resonance imaging apparatus is high in technological content and complicated in system constitution, and if there is a problem or a fault occurring in any one subsystem thereof, it will directly affect normal running of the apparatus, or even affect use safety of the apparatus. Therefore, it is generally necessary to maintain an appropriate operation environment for running of the magnetic resonance imaging apparatus. There are high requirements on power supply, environment temperature and humidity, dust prevention and cleaning, and so on for the magnetic resonance imaging apparatus, and these factors are important for the working condition and service life of the machine. Further, the magnetic resonance imaging apparatus generally needs an uninterruptible power supply, and its cold head and the helium compressor as the auxiliary apparatus generally need to run continuously round the clock.

Moreover, there is a strict requirement on transportation of the magnetic resonance imaging apparatus. For example, when the magnetic resonance imaging apparatus is produced from a factory, it is filled therein with liquid helium. The liquid helium is a non-renewable and rare strategic resource, and has been included in the list of 35 key materials by China, U.S.A., EU and other major economies. The liquid helium is of high value and the loss thereof is a serious wasting to cost and resource. Therefore, it is necessary to reduce loss during transportation. However, in order to prevent loss in liquid helium, it is necessary to power on to enter the working state. Currently, for transportation of the magnetic resonance imaging apparatus, in order to reduce loss in liquid helium during transportation, air transportation is generally used. The air transportation is of a very high cost and there will still be some loss in liquid helium during customs clearance. If sea or land transportation is used, the loss in liquid helium will be increased inevitably due to long time of transportation. Furthermore, if the loss in liquid helium is higher than a safety threshold of the magnetic resonance imaging apparatus, it will cause a quenching risk of the magnetic resonance imaging apparatus, thus resulting in higher economic loss. Moreover, in the land transportation, an electricity generator system can be used for real-time power supply, while in the sea or air transportation, the electricity generator system cannot board a ship or a plane according to the regulations.

As can be seen, there are the following challenges: (1) state monitoring during transportation of the magnetic resonance imaging apparatus, especially during long-distance sea transportation, wherein many problems, such as power supply, environment temperature, humidity, dust prevention and cleaning, cooling system, etc., need to be solved; (2) power-on transportation of the magnetic resonance imaging apparatus; (3) failure in boarding of the electricity generator system; (4) cargo stacking during sea transportation; (5) energy loss within the magnetic resonance imaging apparatus, such as the nuclear magnetic resonance system, during transportation, wherein energy saving should be considered; and (6) cost saving in transportation of the magnetic resonance imaging apparatus.

SUMMARY

In accordance with the present disclosure, a sea-land-air intermodal transportation apparatus for a magnetic resonance imaging apparatus is provided, solving problems of relatively high transportation cost and relatively high loss in liquid helium. The technical solution thereof is set forth as follows:

A sea-land-air intermodal transportation apparatus for a magnetic resonance imaging apparatus comprises: a primary container body, a secondary container body, a power supply system, a temperature controlling system, and a monitoring system, the primary container body is mounted with the temperature controlling system, the monitoring system and a slide rail device for fixing in position the magnetic resonance imaging apparatus, the secondary container body is mounted with the power supply system, and the primary container body and the secondary container body can be fixedly mounted on the same hoisting frame, when the primary container body is on shore, it is powered by the power supply system of the secondary container body, and when the primary container body is on board or in the air, the temperature controlling system, the monitoring system and other apparatus(es) in the primary container body are connected to a mains power supply interface or directly to a shipboard power supply.

The primary container body is provided with a separation plate dividing the primary container body into an electrical chamber and a storage chamber. The separation plate is provided thereon with an air inlet fan, an air outlet fan and a line through hole. The air inlet fan is provided above the separation plate and is used for discharging hot air from the storage chamber into the electrical chamber, and the air outlet fan is provided below the separation plate and is used for blowing cold wind of a cooler of the electrical chamber into the storage chamber.

The slide rail device comprises several slide rails mounted at a lower end of the primary container body. The slide rail is provided thereon with a position limiting assembly. The position limiting assembly comprises a first position limiting block and a second position limiting block which are arranged symmetrically on both sides of the slide rail. The first position limiting block is mounted by a first mounting shaft onto the slide rail and a first position limiting torsion spring is provided between the first position limiting block and the first mounting shaft. The second position limiting block is mounted by a second mounting shaft onto the slide rail, a second position limiting torsion spring is provided between the second position limiting block and the second mounting shaft, and the position limiting assembly further comprises a position limiting seat that is fixedly mounted on the slide rail by a third mounting shaft.

The primary container body is formed by container boards which comprise a bottom board, a top board and a side board, having an interlayer structure or a multilayer composite structure. When the container board is in the interlayer structure, it is formed by hot pressing by an inner covering, a heat insulation layer and an outer covering wherein the inner or outer covering is a whole sheet of fiber glass-reinforced plastic, and the heat insulation layer is a polyurethane foam layer or is a structure of two layers of unsaturated polyester resin matrix layers and a high-strength glass fiber layer there between. When the container board is in the multilayer composite structure, a fireproof layer and/or a sandwich layer are/is provided, wherein the sandwich layer is of a material of carbon fiber composite material, aramid fiber composite material, rock wool, high-strength active/reactive powder concrete plate or high-strength steel fiber concrete plate.

The temperature controlling system comprises a water cooler and a wind cooler that comprises a cooler and a temperature controlling external machine. The water cooler and the cooler are mounted in the primary container body, and the temperature controlling external machine is mounted in the secondary container body. The water cooler is used for cooling a helium compressor of the magnetic resonance imaging apparatus, and the wind cooler is used for regulating and controlling a temperature within the primary container body to ensure an operation temperature of the water cooler.

The secondary container body is provided therein with the power supply system. The power supply system is an electricity generator on the secondary container body or a mains power plug at the primary container body for connection with an external power source and can supply power for the temperature controlling system, the monitoring system and other apparatus(es) in the primary container body.

The electrical chamber of the primary container body is provided with a monitoring window and a line winding bracket. The monitoring window is used for cooperation with a magnet detector, and the line winding bracket is used for arranging connection lines of the temperature controlling system, the monitoring system and other apparatus(es).

Each of the primary container body and the secondary container body is mounted, at an inner corner position, with a damping seat in an L shape, and the damping seat is provided at its outer side with a mounting threaded hole and is provided at its inner side with a damping cushion having a section of a sector shape structure.

Each of the primary container body and the secondary container body is mounted at its lower end with several FOOTMASTER® casters and is mounted at its top with a hoisting structure.

The primary container body and the secondary container body can be movably connected. A structure for the movable connection comprises an L-shape connection plate connected at a connection position of the primary container body and the secondary container body, and the L-shape connection plate is connected by bolts onto the primary container body and the secondary container body, respectively.

The sea-land-air intermodal transportation apparatus for a magnetic resonance imaging apparatus can achieve flexible mounting/dismounting, stable power supply, and overall monitoring, thus meeting the requirements of sea, land and air transportation and the requirement of intermodal transportation by cooperation thereof. The present apparatus can adjust temperature and humidity, control and reduce loss in liquid helium, and achieve reduction in transportation cost.

4

DETAILED DESCRIPTION OF THE DRAWINGS
(ILLUSTRATIVE EXAMPLES)

In the figures, the names of the components are listed as follows:

1—primary container body
2—hoisting ring
3—secondary container body
4—electrical chamber
5—storage chamber
6—FOOTMASTER® caster
7—separation plate
8—slide rail
9—magnetic resonance imaging apparatus
10—helium compressor
11—water cooler
12—handle
13—L-shape connection plate
14—damping cushion
15—threaded hole
16—damping seat
17—third mounting shaft
18—position limiting seat
19—first position limiting block
20—first mounting shaft
21—second mounting shaft
22—second position limiting block
23—observation window
24—ladder
25—line winding bracket
26—electricity generator
27—rolling door
28—front door
29—line through hole
30—cooler
31—temperature controlling external machine
32—air inlet fan
33—air outlet fan Hereinafter, specific embodiments will be provided to explain the implementations of the present disclosure. Those skilled in the art can easily understand other advantages and effects of the present illustrative example by the content as disclosed in the present description.

Figure 1:
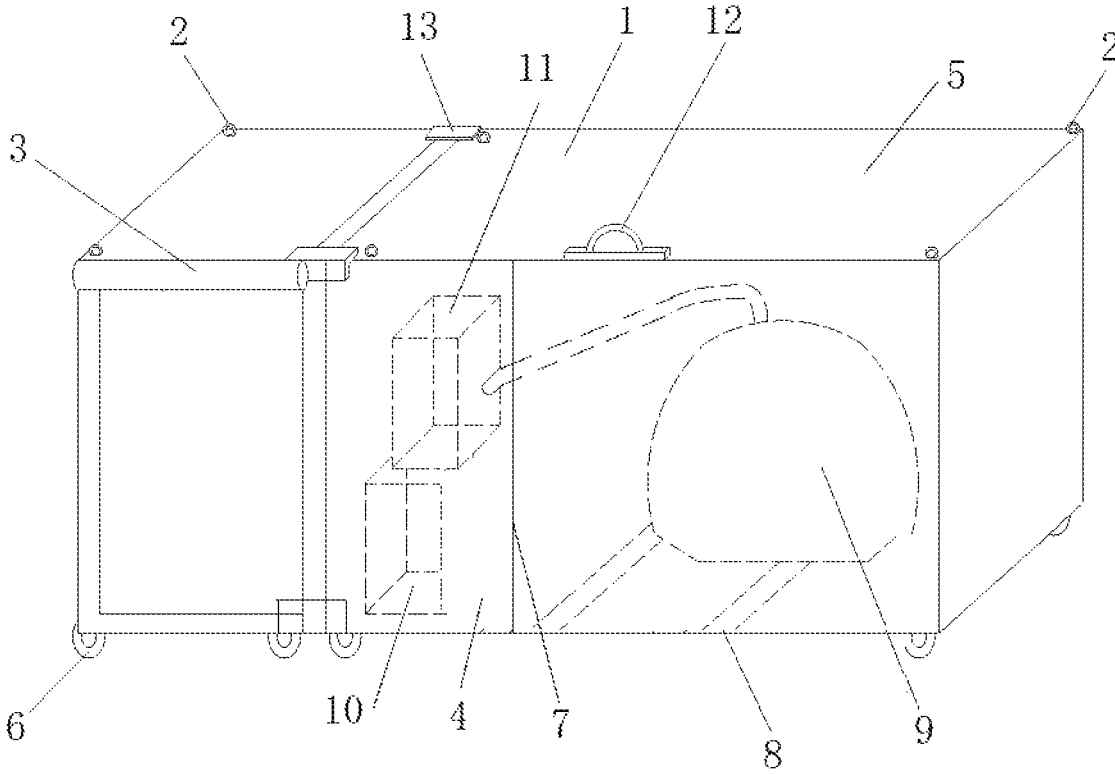
FIG. 1 is a schematic overall structure diagram of the sea-land-air intermodal transportation apparatus for a magnetic resonance imaging apparatus in accordance with the present disclosure.

As shown in FIG. 1, the sea-land-air intermodal transportation apparatus for a magnetic resonance imaging apparatus comprises: a primary container body 1, a secondary container body 3, a power supply system, a temperature controlling system, and a monitoring system. The primary container body 1 is mounted with the temperature controlling system, the monitoring system, and a slide rail device for fixing in position the magnetic resonance imaging apparatus 9. The secondary container body 3 is mounted with the power supply system. Each of the primary container body 1 and the secondary container body 3 is mounted at its lower end with several movable wheels (which may use FOOT-MASTER® casters 6) to facilitate fixing and moving. The primary container body 1 and the secondary container body 3 can be fixedly mounted on the same hoisting frame. Each of the primary container body 1 and the secondary container body 3 is mounted at its top with a hoisting structure. The hoisting structure comprises hoisting rings 2 provided at four top corners of the primary container body 1 and hoisting rings 2 provided at four top corners of the secondary container body 3. The hoisting rings 2 function to facilitate crane hoisting. The primary container body 1 is mounted, at a middle position of its top, with a handle 12 by which the top of the primary container body 1 can be opened.

The primary container body 1 and the secondary container body 3 can be movably connected. A structure for the movable connection comprises an L-shape connection plate 13 connected at a connection position of the primary container body 1 and the secondary container body 3, and the L-shape connection plate 13 is connected by bolts onto the primary container body 1 and the secondary container body 3, respectively. The primary container body 1 and the secondary container body 3 can be disassembled and combined freely. They can be connected together with each other by the L-shape connection plate 13 and the bolts, and can be combined according to different precision instruments. Moreover, the primary container body 1 is provided therein with the slide rail that can be used for mounting with different magnetic resonance imaging apparatuses 9, and the secondary container body 2 is provided at its lower end with a backing plate that is used for mounting auxiliary instruments (such as an electricity generator apparatus) corresponding to the precision instruments. It is excellent in generality, facilitating sea-land-air intermodal transportation. In addition, the slide rail device is designed to facilitate moving-in/out of the instruments, effectively protecting security/safety of the instruments. The primary container body 1 uses a closed design and can meet the requirements during transportation of different types of the magnetic resonance imaging apparatuses 9 in many aspects (power supply, temperature, humidity, dust prevention, and others). Also, with the configuration of the two container bodies (i.e. the primary container body 1 and the secondary container body 3), by different spaces, it can prevent any pollution produced by the power supply system in the secondary container body 3 during operation from influencing the magnetic resonance imaging apparatus 9.

Figure 2:
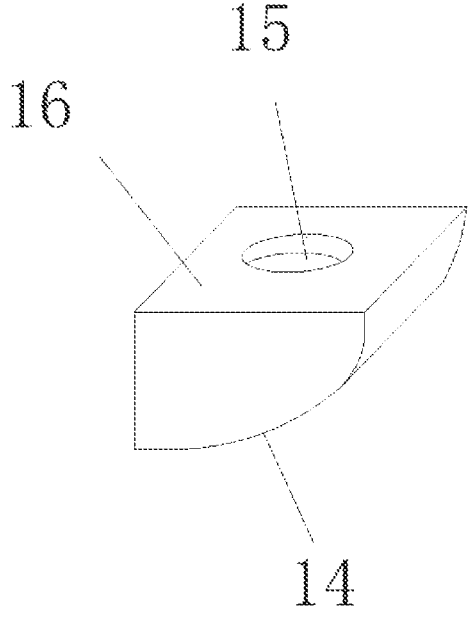
FIG. 2 is a structure diagram of a damping seat in accordance with the present disclosure.

As shown in FIG. 2, the primary container body 1 is provided therein with a primary cavity, and the secondary container body 3 is provided therein with a secondary cavity. Each of the primary container body 1 and the secondary container body 3 is mounted, at an inner corner position, with a damping seat 16 in an L shape. The damping seat 16 is provided at its outer side with a mounting threaded hole 15 and is provided at its inner side with a damping cushion 14 having a section of a sector shape structure. Such design is used to prevent damage due to collision.

Figure 3:
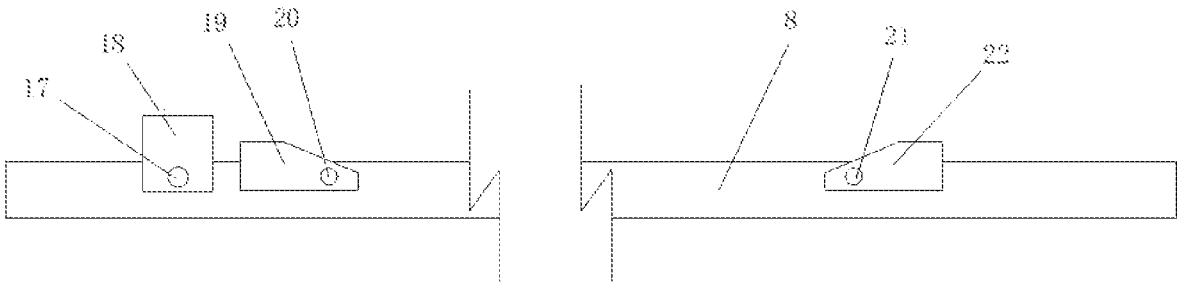
FIG. 3 is a schematic structural diagram of the slide rail in accordance with the present disclosure.

As shown in FIG. 3, the slide rail device, provided at the lower end of the primary container body 1, comprises several slide rails 8 mounted at a lower end of the primary container body. The slide rail 8 is provided thereon with a position limiting assembly. The position limiting assembly comprises a first position limiting block 19 and a second position limiting block 22 which are arranged symmetrically on both sides of the slide rail 8. The first position limiting block 19 is mounted by a first mounting shaft 20 onto the slide rail. A first position limiting torsion spring is provided between the first position limiting block 19 and the first mounting shaft 20. The second position limiting block 22 is mounted by a second mounting shaft 21 onto the slide rail. A second position limiting torsion spring is provided between the second position limiting block 22 and the second mounting shaft 21. With such design, it is possible to adjust a height of the position limiting block to adapt to different instruments and ensure generality. The position limiting assembly further comprises a position limiting seat 18 which is fixedly mounted on the slide rail by a third mounting shaft 17. The third mounting shaft 17 is fixedly mounted in a manner of bolt mounting. Thus, as long as the threaded hole is provided on the slide rail, the position of the position limiting seat 18 is adjustable. This is also to ensure generality. The position limiting block provided at the slide rail device can be adjusted according to a bottom size of the magnetic resonance imaging apparatus 9 such that the slide rail is provided thereon with the position limiting block which can be adjusted according to a bottom size of the magnetic resonance imaging apparatus, achieving fixing between the magnetic resonance imaging apparatus 9 and the primary container body 1. Moreover, the slide rail and the position limiting block are mounted with damping means, and the vibration during transportation of the magnetic resonance imaging apparatus 9 can be reduced.

Figure 4:
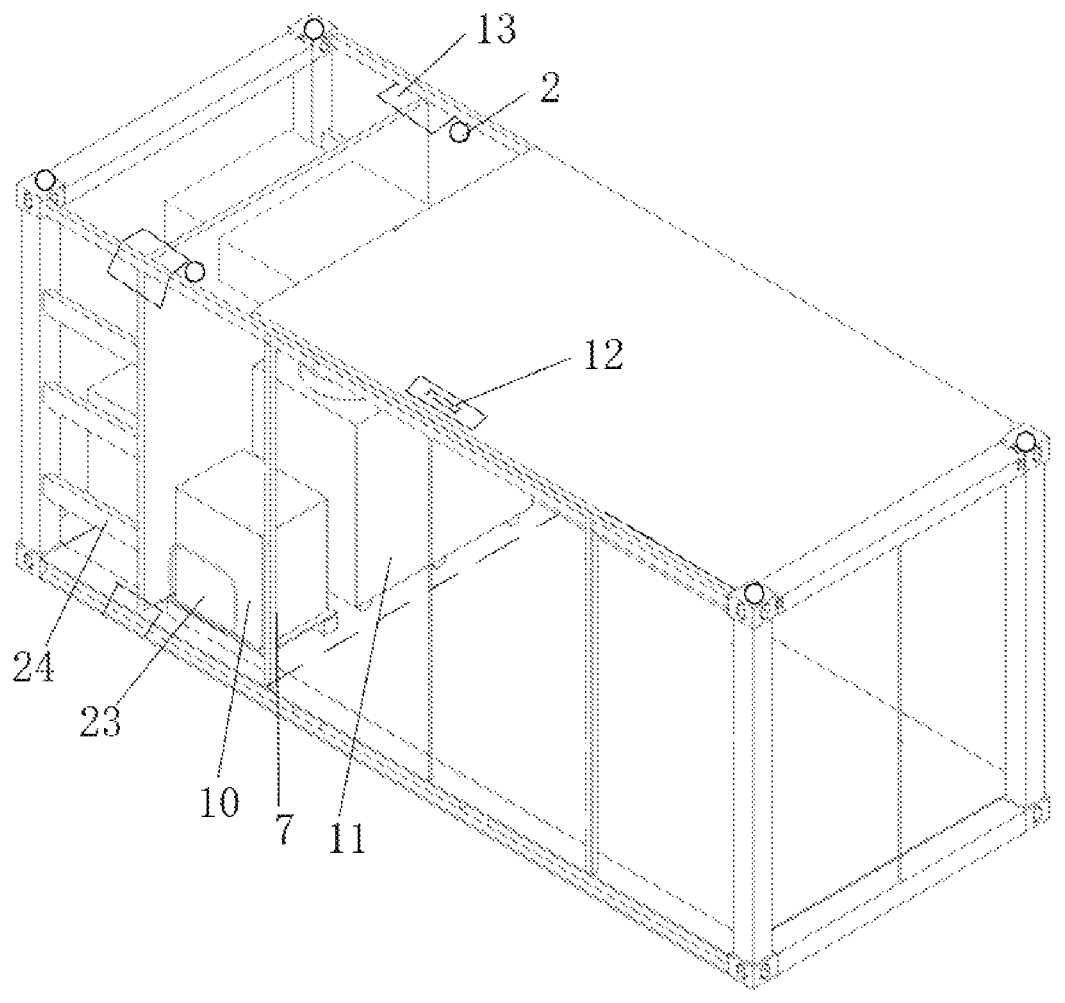
FIG. 4 is a perspective view of the schematic diagram of the apparatus depicted in FIG. 1 in accordance with the present disclosure.
Figure 7:
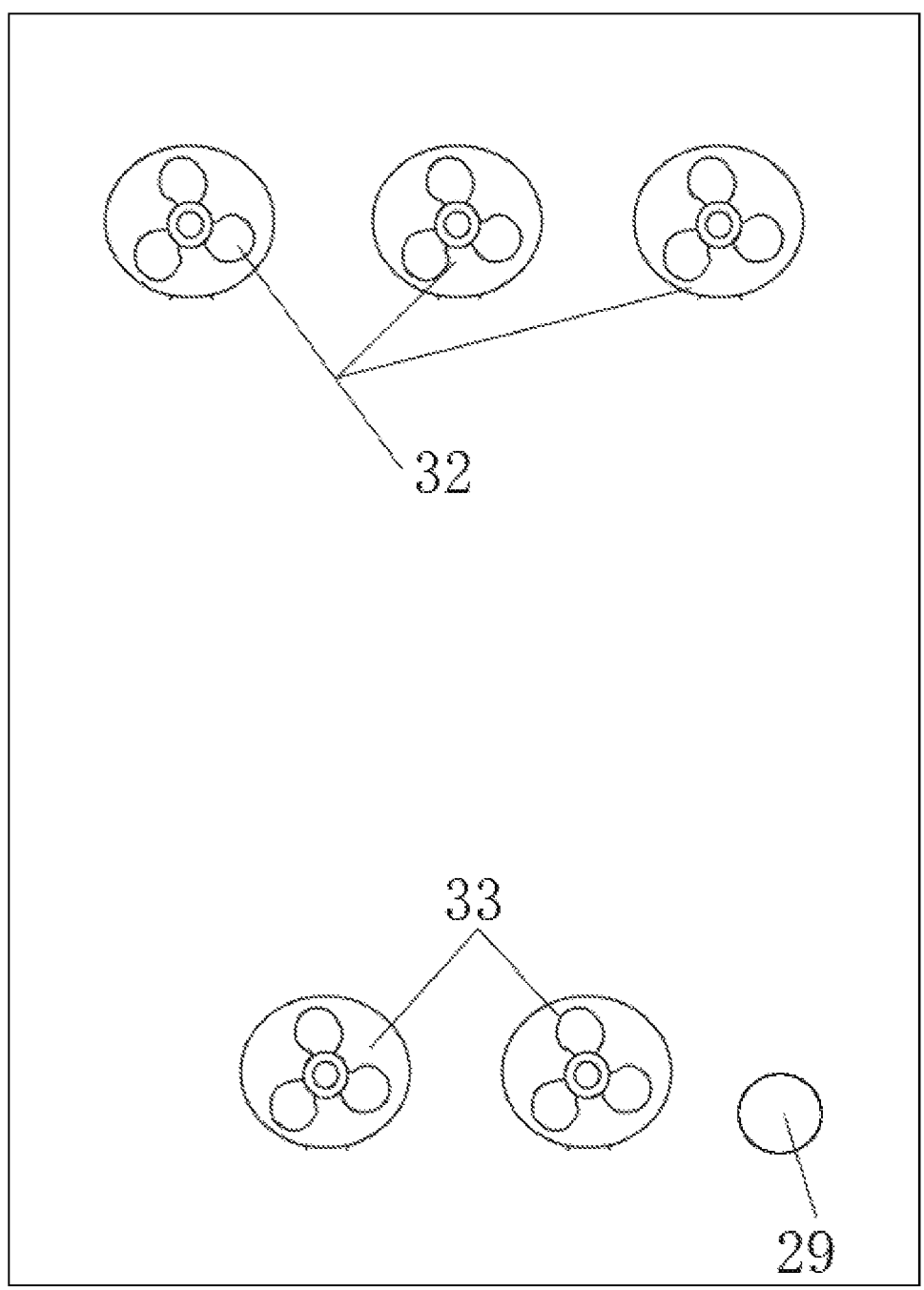
FIG. 7 is a diagram of the separation plate in accordance with an illustrative example of the present disclosure.

As shown in combination with FIG. 4, the primary container body is provided with a separation plate 7 dividing the primary container body into an electrical chamber 4 and a storage chamber 5, to further separate the electric apparatuses from the magnetic resonance imaging apparatus 9, reduce the potential fire risk, and also adjust and control the temperature and humidity more precisely. As shown in combination with FIG. 7, the separation plate 7 is provided thereon with an air inlet fan 32, an air outlet fan 33 and a line through hole 29. There are 3 air inlet fans 32 provided above the separation plate 7, for discharging hot air from the storage chamber 5 into the electrical chamber 4, and there are 2 air outlet fans 33 provided below the separation plate 7, for blowing cold wind of a cooler 30 of the electrical chamber 4 into the storage chamber 5. The line through hole 29 is used for pass-through by other lines.

The electrical chamber 4 of the primary container body 1 is provided with a monitoring window 23 and a line winding bracket 25. The monitoring window 23 can be used for cooperation with a magnet detector. The monitoring person outside the container can monitor the apparatus in the container, especially various data of the helium compressor, via the monitoring observation window 23, without entering the container. After the apparatuses are electrically connected within the electrical chamber 4, some connection lines are collected, arranged and hung on the line winding bracket 25 to keep tidy inside the container. Moreover, the helium pipe in connection with the helium compressor and the magnet is hung on the line winding bracket after circling and thus can be effectively protected from damage. The primary cavity is provided at its front side with an openable front door 28. The primary container body 1 is in conformity with the international standard for containers, such as ISO1161 standard.

The temperature controlling system comprises a water cooler 11 and a wind cooler which comprises a cooler 30 and a temperature controlling external machine 31. The water cooler 11 and the cooler 30 are mounted in the primary container body 1 and the temperature controlling external machine 31 is mounted in the secondary container body 3. The water cooler 11 is used for cooling a helium compressor 10 of the magnetic resonance imaging apparatus 9. The wind cooler is used for regulating and controlling a temperature within the primary container body 1 to ensure an operation temperature of the water cooler 11. The temperature controlling system regulates and controls a temperature in the primary container body 1 such that the magnetic resonance imaging apparatus 9 is in an appropriate operation environment. The cooler 30 provides cold wind for the electrical chamber 4, and uses the air outlet fan 33 mounted at the separation plate 7 to individually provide cold wind for the storage chamber 5.

The electrical chamber 4 is fixedly mounted with a helium compressor 10 and a water cooler 11. The helium compressor 10 is used for preventing the liquid helium in the nuclear magnetic main machine of the magnetic resonance imaging apparatus 9 from escaping. The power supply system is electrically connected with the magnetic resonance imaging apparatus 9 to prevent helium from escaping, actually by electrically connection of the power supply system with the helium compressor 10. The helium compressor 10 will produce heat during operation and such heat production will have a negative effect on helium compression. In order to prevent such effect, it is possible to provide a water cooler 11, connected with the helium compressor 10, in the electrical chamber 4, to cool the helium compressor 10. The water cooler 11 contains a water coolant which can be introduced into the helium compressor 10 to cool the helium compressor 10, and be recirculated back into the water cooler to bring the heat away. The water cooler 11 is further provided thereon with a heat dissipation fan. The heat brought back into the water cooler by the water coolant can be removed by the heat dissipation fan, thus discharging the heat out of the water cooler 11 and cooling the water cooler for further use.

Figure 5:
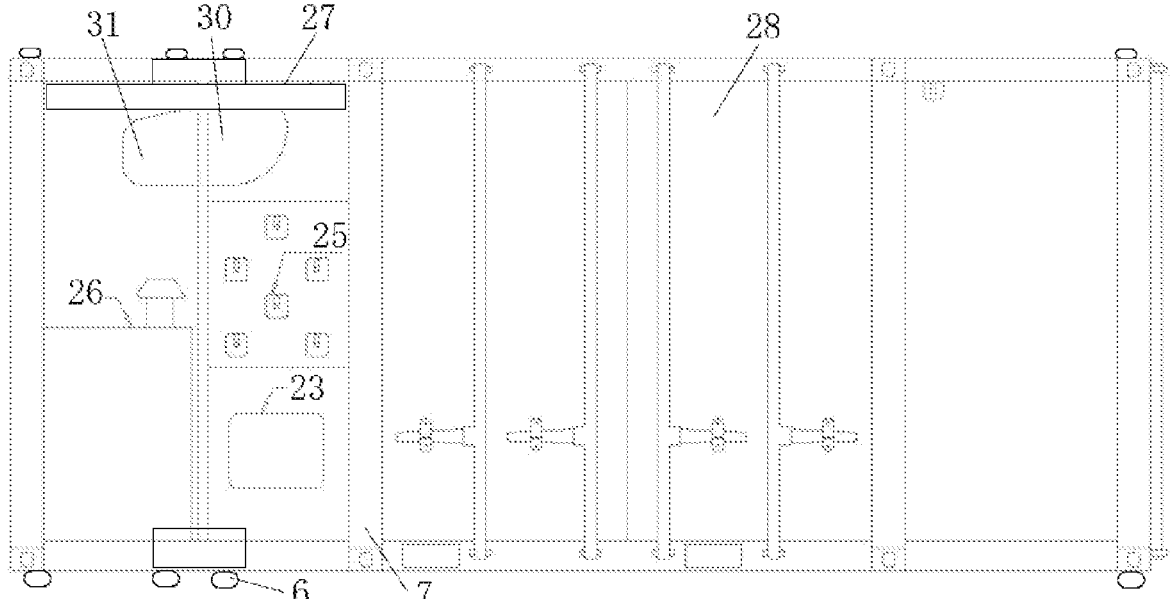
FIG. 5 is a front view of the schematic diagram of the apparatus depicted in FIG. 1 in accordance with the present disclosure.

As shown in FIG. 5, the secondary container body 3 is provided therein with the power supply system. The power supply system is an electricity generator on the secondary container body or a mains power plug at the primary container body for connection with an external power source, and can supply power for the temperature controlling system, the monitoring system and other apparatus(es) in the primary container body 1. The electricity generator 26 of the secondary container body 3 can supply power to the apparatuses in the primary container body 1 during land transportation. Moreover, the primary container body 1 is provided thereon with a mains power supply socket, and can use the mains power supply socket to connect to the shipboard power supply after disconnection from the secondary container body 3. The secondary container body 3 is provided at its side with a ladder 24. The ladder 24 is provided on the outside of the secondary container body 3, to facilitate the operator to open the top, inject liquid helium, or perform other operations. The secondary container body 3 is also provided at its side top with a rolling door 27 for covering the secondary cavity. The rolling door 27 is a general component, not used for containers in the prior art. The rolling door 27 is closed when the apparatus is not used, to prevent being exposed to the weather, and can be opened when the apparatus is used, to meet the requirements of ventilation, heat dissipation and avoiding direct sunlight.

Figure 6:
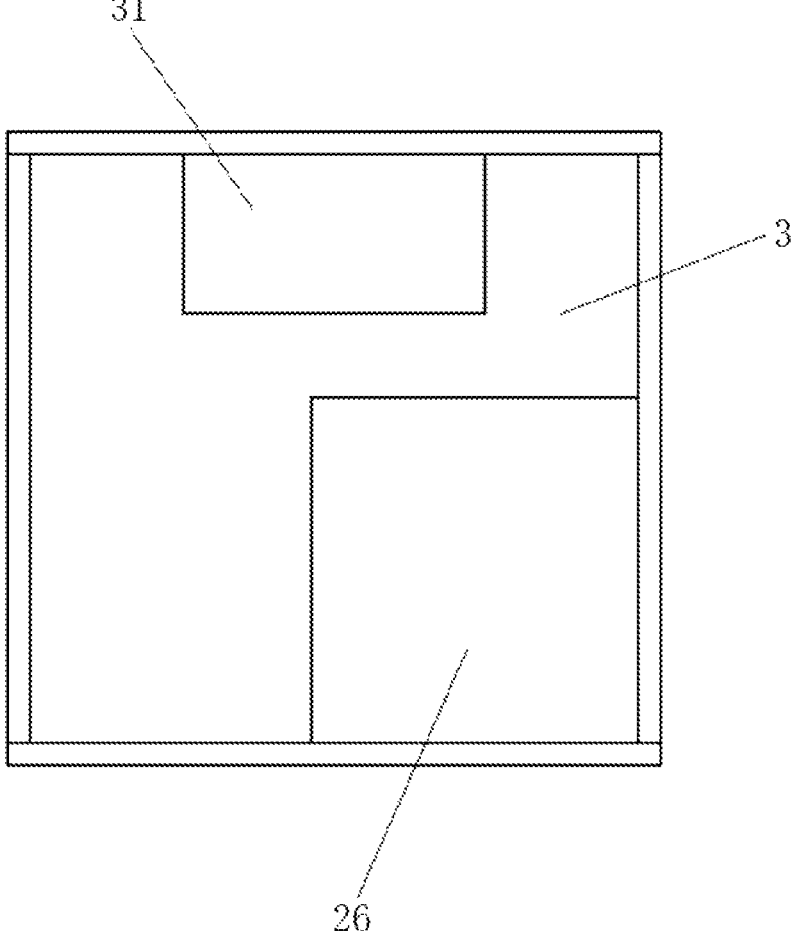
FIG. 6 is a side view of the secondary container body in accordance with the present disclosure.

As shown in FIG. 6, in addition to the mounted electricity generator 26, a temperature controlling external machine 31 and an oil tank 29 are further mounted to the secondary container body 3. The electricity generator 26 uses a diesel electricity generator to meet the need of electric power for the container body apparatuses, lighting, etc. The power supply system may pass through the sealed primary container body 1 by a form of perforation, and a wiring groove is provided in a contact position between the secondary container body 3 and the primary container body 1.

The primary container body 1 is formed by container boards which comprise a bottom board, a top board and a side board, having an interlayer structure or a multilayer composite structure. The inboard apparatuses of the primary container body 1 do not use inflammable materials, and the power source lines selectively use flame retarding cables to ensure security and temperature in the container, especially during use in a long-distance high-temperature strong sunshine shipboard environment. The main structural parts in the primary container body 1 selectively use materials having an outstanding protection performance. The metal structural parts are reasonably connected with one another to avoid electrochemical corrosion of the metals. The fastening parts and structural parts, especially the structural parts being frequently mounted/dismounted or opened, use the stainless steel material, or are specially processed (painting after hot-galvanizing). Before spraying with the outside paint, the whole outside surface is processed by arc spraying with rare earth Zn Al alloy.

When the container board of the primary container body 1 is in the interlayer structure, it may be formed by hot pressing by an inner covering, a heat insulation layer and an outer covering, as the fireproof and heat insulation materials. The inner or outer covering is a whole sheet of fiber glass-reinforced plastic. The heat insulation layer is a polyurethane foam layer. The insulation performance of the polyurethane foam layer can keep a constant temperature environment in the space where the apparatus is placed, and thus can stabilize the operation environment of the apparatus. Further, the heat insulation layer is a structure of two layers of unsaturated polyester resin matrix layers and a high-strength glass fiber layer there between. Further, the outer covering is made of a fireproof and heat insulation material, such as a rust-resisting aluminum alloy plate.

When the container board of the primary container body 1 is in the multilayer composite structure, a sandwich layer having an explosion prevention function may be further provided, wherein the sandwich layer may be of a material of carbon fiber composite material, aramid fiber composite material, rock wool, high-strength active/reactive powder concrete plate or high-strength steel fiber concrete plate, etc. Specifically, it is appropriate to provide the sandwich layer having the explosion prevention function in the container board adjacent to the power supply system. Further, the container board(s) of the primary container body 1 may be provided, at a side adjacent to the power supply system, with a fire prevention layer which is provided to facilitate preventing fire, occurring due to a fault on a side of the container board, from spreading to the other side, thus effectively protecting the apparatuses and reducing loss during transportation.

In use, the secondary container body 3 is connected by the L-shape connection plate 13 with the primary container body 1, and can be disassembled, to facilitate boarding of the primary container body 1 to a ship or a plane. After boarding to a ship, the apparatus of the primary container body 1 is connected to the mains power supply interface, or may be connected directly to the shipboard power supply. During transportation, the nuclear magnetic main machine, the helium compressor 10, and the temperature controlling system are placed in the primary container body 1, and the power supply system at the secondary container body 3 supplies power to the helium compressor 10. Magnetic field testing is performed to the nuclear magnetic main machine via the observation window 23 provided on the side of the primary container body 1.

In accordance with the present disclosure, the primary container body 1 is provided, on the inner side of the top board, with one or more lighting devices. The line through hole 34 uses a wiring manner of buried wiring which is required in many safety regulations. In accordance with the present illustrative examples, it is possible to pre-bury wiring grooves, such as PVC wiring grooves, in the container board. With the cost restriction, it is also appropriate in some circumstances to arrange the wires at the top or bottom of the container body by a cable bridge frame. The switch and the power distribution box of the lighting device may be fixed on the container board by pre-buried parts. However, other fixing manners are also feasible.

Figure 8:
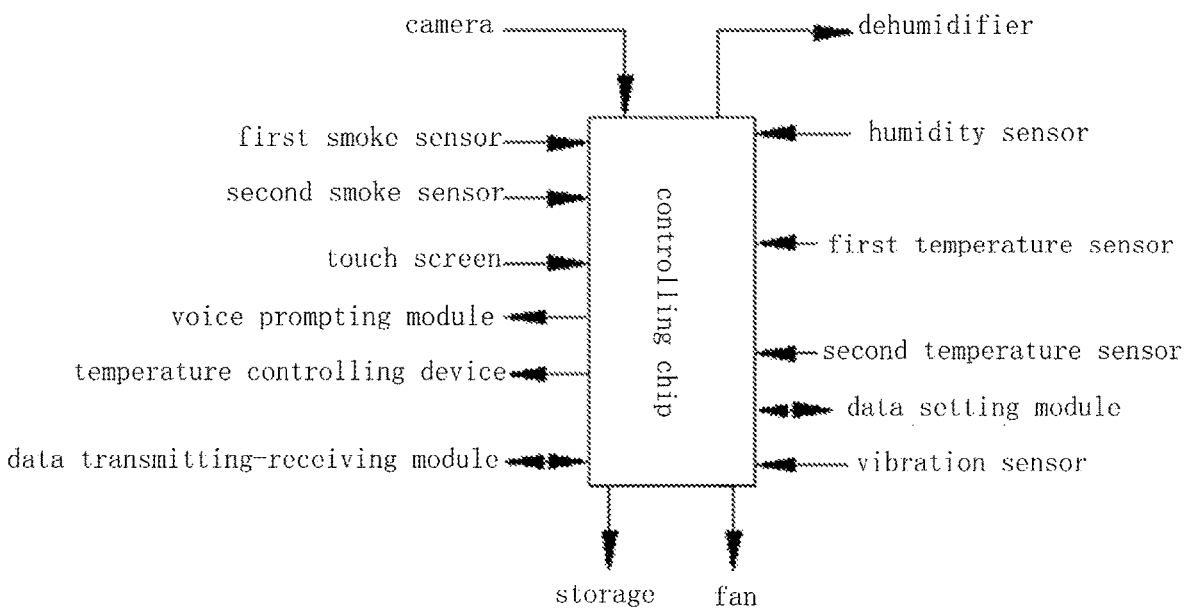
FIG. 8 is an electrical control signal schematic diagram of a control apparatus in accordance with the present disclosure.

As shown in FIG. 8, the primary container body 1 is further provided with a monitoring system. The monitoring system comprises: (1) a vibration sensor mounted at the bottom of the primary container body; (2) smoke sensors mounted at two different chambers of the primary container body 1, including the first smoke sensor at the electrical chamber 4 and the second smoke sensor at the storage chamber 5; (3) a camera mounted at the primary container body 1; and (4) temperature sensors mounted at two different chambers of the primary container body 1, including the first temperature sensor at the electrical chamber 4 and the second temperature sensor at the storage chamber 5. The display and the keyboard use a touch screen. Further, the controlling chip is electrically connected with a voice prompting module. The storage uses a waterproof hard disk.

The primary container body 1 is fixedly mounted, at its inner wall, with a controlling box of the monitoring system. The PCB of the controlling box is provided with the controlling chip. The controlling chip is used for connecting with the sensors, the camera, a data transmitting-receiving module, the display, the keyboard and the storage, and controlling operations of a dehumidifier, the temperature controlling system, the fans, etc., according to the input signals. When there is a problem, it is possible to provide an alarm by the data transmitting-receiving module and provide a prompt by the voice prompting module.

Herein, the controlling box uses a PLC controlling box, or uses a PC host machine, or uses a controlling board having an ARM, Infineon, or Kirin controlling chip with mobile performance. The data transmitting-receiving module uses a wireless or wired data transmitting-receiving chip to achieve data transmission.

Moreover, the controlling chip is further connected with a data setting module to facilitate the user to set comparison data of a data comparison module and facilitate storage of different magnetic resonance imaging apparatuses by the transportation container.

The depicted structures, scales, dimensions of the accompanying figures of the present description are used only for corresponding to the content as disclosed in the description to be understood and read by those skilled in the art, not for limiting the present invention within the implementable limiting condition(s), and thus do not have any technically substantial meaning. Any modification in structure, change in scale relation, or adjustment in dimension will fall within the scope covered by the technical content as disclosed in the present invention, without influencing the effect(s) produced by the present invention and the purpose(s) achieved by the present invention. Moreover, the words of "upper", "lower", "left", "right", "middle", "a", and the like, as used in the present description, are used only for facilitating clear explanation, not for limiting the implementable scope of the present invention. Any change or adjustment in relative relation, without substantial modification in technical content, should be regarded as being within the implementable scope of the present invention.

Compared with the prior art, the present disclosure of an apparatus has the following beneficial effects:

Being Flexible

In the present disclosure of illustrative examples, the primary container body and the secondary container body can be disassembled and combined freely. They can be connected together with each other by the L-shape connection plate and the bolts. Moreover, the primary container body is provided therein with the slide rail device and the fixing position can be adjusted according to different magnetic resonance imaging apparatuses. The secondary container body is mounted, on its backing plate, with auxiliary instruments (such as an electricity generator apparatus) corresponding to the magnetic resonance imaging apparatus. The present disclosure facilitates sea-land-air intermodal transportation. In addition, the slide rail is designed to facilitate moving-in/out of the instruments, effectively protecting security of the instruments. Each of the primary container body and the secondary container body is mounted, at its bottom, with 4 FOOTMASTER® casters and the container bodies can be easily fixed and moved. Each of the primary container body and the secondary container body is provided on its top with hoisting rings to facilitate hoisting, and is provided on its bottom with a forklift hole position to facilitate movement by a forklift.

Stable Supply

During transportation of the magnetic resonance imaging apparatus, by the present disclosure, the power supply system can supply power to the helium compressor to enable stable operation of the helium compressor such that the helium compressor can compress gaseous helium escaping from the nuclear magnetic main machine to restore it into liquid helium and recycle the liquid helium to the magnetic resonance imaging apparatus. Such design can effectively reduce loss in liquid helium, and thus can significantly reduce wasting in resource and cost. The container bodies are configured to provide a protection structure for the power supply system and the magnetic resonance imaging apparatus such that the power supply system and the magnetic resonance imaging apparatus are held in a relatively stable environment. Thus, it is beneficial for operation of the power supply system and the magnetic resonance imaging apparatus, and it can prevent damage of the power supply system and the magnetic resonance imaging apparatus, and further can extend service lives of the power supply system and the magnetic resonance imaging apparatus.

Overall Monitoring (1) In the present disclosure, by using the monitoring cameras, the smoke sensors, the temperature and humidity sensors, and the vibration sensors for monitoring collection, and using a processor for display the early warning, it has the advantage of enabling monitoring, thus solving the problem of influence of environment factors on the magnetic resonance imaging apparatus due to failure in monitoring the magnetic resonance imaging apparatus during use of the prior container, and extending the service life of the magnetic resonance imaging apparatus.

(2) In the present disclosure, by configuring the display controlling module as a vehicle touch screen, it can facilitate controlling the monitoring cameras by the user and facilitate observation from multiple perspectives by the user.

(3) In the present disclosure, by providing the voice prompting module, it can prompt the user, and avoid the case that the user cannot rapidly understand the warning information.

(4) In the present disclosure, by providing two smoke sensors in two different chambers of the primary container body, respectively, it can improve the detection efficiency of the smoke sensors.

(5) In the present disclosure, by providing the storage, it can record the operation flow of the user and also can store various data.

(6) In the present disclosure, by providing the data setting module, it can facilitate the user to set the comparison data of the data comparison module, and facilitate storage for different magnetic resonance imaging apparatuses by the transportation containers.

What is claimed is:

1. A sea-land-air intermodal transportation apparatus for a magnetic resonance imaging apparatus comprising:

a primary container body, a secondary container body, a power supply system, a temperature controlling system, and a monitoring system, wherein:

the primary container body is mounted with the temperature controlling system, the monitoring system and a slide rail device for fixing the magnetic resonance imaging apparatus, the secondary container body is mounted with the power supply system, and the primary container body and the secondary container body can be fixedly mounted on the same hoisting frame, the apparatus is further configured such that:

on shore, the primary container body is powered by the power supply system of the secondary container body, and on board a ship or on a plane, the temperature controlling system, the monitoring system and other apparatus(es) in the primary container body are connected to at least one power source taken from the group consisting of:

a mains power supply interface, and a shipboard power supply of the ship or the plane.

2. The sea-land-air intermodal transportation apparatus for a magnetic resonance imaging apparatus according to claim 1, wherein the primary container body is provided with a separation plate dividing the primary container body into an electrical chamber and a storage chamber, wherein the separation plate is provided thereon with an air inlet fan, an air outlet fan and a line through hole, wherein the air inlet fan is provided above the separation plate and is used for discharging hot air from the storage chamber into the electrical chamber, and wherein the air outlet fan is provided below the separation plate and is used for blowing cold wind of a cooler of the electrical chamber into the storage chamber.

3. The sea-land-air intermodal transportation apparatus for a magnetic resonance imaging apparatus according to claim 1, wherein the slide rail device comprises several slide rails mounted at a lower end of the primary container body, wherein the slide rail is provided thereon with a position limiting assembly, wherein the position limiting assembly comprises a first position limiting block and a second position limiting block which are arranged symmetrically on both sides of the slide rail, wherein the first position limiting block is mounted by a first mounting shaft onto the slide rail and a first position limiting torsion spring is provided between the first position limiting block and the first mounting shaft, wherein the second position limiting block is mounted by a second mounting shaft onto the slide rail and a second position limiting torsion spring is provided between the second position limiting block and the second mounting shaft, and wherein the position limiting assembly further comprises a position limiting seat which is fixedly mounted on the slide rail by a third mounting shaft.

4. The sea-land-air intermodal transportation apparatus for a magnetic resonance imaging apparatus according to claim 1, wherein the primary container body is formed by container boards that comprise: a bottom board, a top board and a side board, having an interlayer structure or a multilayer composite structure such that:

the container board in the interlayer structure is formed by hot pressing by an inner covering, a heat insulation layer and an outer covering, wherein the inner or outer covering is a whole sheet of fiber glass-reinforced plastic, and the heat insulation layer is a polyurethane foam layer or is a structure of two layers of unsaturated polyester resin matrix layers and a high-strength glass fiber layer there between; and the container board in the multilayer composite structure includes a fireproof layer and/or a sandwich layer, wherein the sandwich layer is of a material of carbon fiber composite material, aramid fiber composite material, rock wool, high-strength active/reactive powder concrete plate or high-strength steel fiber concrete plate.

5. The sea-land-air intermodal transportation apparatus for a magnetic resonance imaging apparatus according to claim 1, wherein the temperature controlling system comprises a water cooler and a wind cooler comprising a cooler and a temperature controlling external machine, wherein the water cooler and the cooler are mounted in the primary container body and the temperature controlling external machine is mounted in the secondary container body, wherein the water cooler is used for cooling a helium compressor of the magnetic resonance imaging apparatus, and wherein the wind cooler is used for regulating and controlling a temperature within the primary container body to ensure an operation temperature of the water cooler.

6. The sea-land-air intermodal transportation apparatus for a magnetic resonance imaging apparatus according to claim 1, wherein the secondary container body is provided therein with the power supply system, and wherein the power supply system is an electricity generator on the secondary container body or a mains power plug at the primary container body for connection with an external power source, and can supply power for the temperature controlling system, the monitoring system and other apparatus(es) in the primary container body.

7. The sea-land-air intermodal transportation apparatus for a magnetic resonance imaging apparatus according to claim 1, wherein the electrical chamber of the primary container body is provided with a monitoring window and a line winding bracket, wherein the monitoring window is used for cooperation with a magnet detector, and wherein the line winding bracket is used for arranging connection lines of the temperature controlling system, the monitoring system and other apparatus(es).

8. The sea-land-air intermodal transportation apparatus for a magnetic resonance imaging apparatus according to claim 1, wherein each of the primary container body and the secondary container body is mounted, at an inner corner position, with a damping seat in an L shape, and wherein the damping seat is provided at its outer side with a mounting threaded hole and is provided at its inner side with a damping cushion having a section of a sector shape structure.

9. The sea-land-air intermodal transportation apparatus for a magnetic resonance imaging apparatus according to claim 1, wherein each of the primary container body and the secondary container body is mounted at its lower end with several casters and is mounted at its top with a hoisting structure.

10. The sea-land-air intermodal transportation apparatus for a magnetic resonance imaging apparatus according to claim 1, wherein the primary container body and the secondary container body can be movably connected, wherein a structure for the movable connection comprises an L-shape connection plate connected at a connection position of the primary container body and the secondary container body, and wherein the L-shape connection plate is connected by bolts onto the primary container body and the secondary container body, respectively.

* * * * *